United States Patent
Heo et al.

(10) Patent No.: US 7,351,661 B2
(45) Date of Patent: Apr. 1, 2008

(54) SEMICONDUCTOR DEVICE HAVING TRENCH ISOLATION LAYER AND A METHOD OF FORMING THE SAME

(75) Inventors: Jin-Hwa Heo, Inchun (KR); Soo-Jin Hong, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 394 days.

(21) Appl. No.: 10/734,354

(22) Filed: Dec. 12, 2003

(65) Prior Publication Data

US 2004/0209479 A1   Oct. 21, 2004

Related U.S. Application Data

(62) Division of application No. 09/990,740, filed on Nov. 16, 2001, now Pat. No. 6,683,354.

(51) Int. Cl.
*H01L 21/302* (2006.01)
(52) U.S. Cl. .......... 438/689; 438/690; 438/424; 438/454; 438/710; 438/720; 438/978; 257/397; 257/510; 257/522; 257/216; 257/80; 257/97
(58) Field of Classification Search .......... 438/690; 257/397; 216/80
See application file for complete search history.

(56) References Cited

U.S. PATENT DOCUMENTS 5,728,621 A * 3/1998 Zheng et al. .............. 438/427
5,770,260 A * 6/1998 Fukuyama et al. ......... 427/226
5,801,083 A * 9/1998 Yu et al. .................... 438/424
6,051,480 A * 4/2000 Moore et al. .............. 438/435
6,127,241 A * 10/2000 Rha .......................... 438/437
6,187,651 B1 * 2/2001 Oh ............................ 438/435

FOREIGN PATENT DOCUMENTS

JP          03-263352        11/1991
KR       1020010001735       1/2001

* cited by examiner

*Primary Examiner*—Duy-Vu N. Deo
*Assistant Examiner*—Maki Angadi
(74) *Attorney, Agent, or Firm*—F.Chau & Associates, LLC

(57) ABSTRACT

A semiconductor device having a trench isolation layer in a semiconductor substrate is provided, wherein the trench isolation layer includes a silicon nitride liner, a silicon oxide liner; and a buried layer, wherein the buried layer includes a first buried layer for filling a lower part of the trench isolation layer and a second buried layer for filling an upper part of the trench isolation layer. A semiconductor device preferably further includes a silicon oxide layer disposed between the semiconductor substrate and the silicon nitride liner. The silicon oxide layer includes a thermal oxide layer densified at a temperature over about 800° C.

9 Claims, 3 Drawing Sheets

SEMICONDUCTOR DEVICE HAVING TRENCH ISOLATION LAYER AND A METHOD OF FORMING THE SAME

RELATED APPLICATION

This is a divisional of application Ser. No. 09/990,740, filed Nov. 16, 2001 now U.S. Pat. No. 6,683,354.

This application claims priority to Korean Patent Application No. 2001-12603, filed on Mar. 12, 2001, the contents of which are herein by reference in their entirety.

FIELD OF THE INVENTION

The present invention relates to a semiconductor device and a fabrication method therefor, and more particularly, to a semiconductor device having a trench isolation layer and a fabrication method therefor.

BACKGROUND OF THE INVENTION

As integration density of semiconductor memory devices (e.g., DRAMs) increases, circuit components such as transistors are formed closer to each other and reliability of the devices decreases unless effective isolation techniques for separating devices such as MOS transistors next to each other are employed. Trench isolation techniques which can form an isolation region having a narrow width are widely used in the manufacture of highly integrated semiconductor memory devices. Other conventional isolation methods include local oxidation of silicon (LOCOS).

However, as integration density of the semiconductor memory device increases, the width of the trench in which the isolation layer is formed is also diminished. Therefore, an effective method of filling the trench without a void or a seam is needed.

Silicon oxide is commonly used as trench filing material. Various methods for forming an oxide layer, which has relatively good gap filling properties, are proposed for filling a trench having high aspect ratio. One of the methods by use of a silicon oxide composed of TEOS(Tetra Ethyl Ortho Silicate)-USG (Undoped Silicate Glass) or a silicon oxide composed of HDP (High Density Plasma)-CVD (Chemical Vapor Deposition) is suggested. However, such a method is not suitable for filling a trench having a very high aspect ratio, e.g., a width of about 1200 Å and a depth of about 6000 Å.

Another known method for filling a trench is using a Spin-on-Glass (SOG) layer. SOG is a liquid state or a sol state in the first time, therefore, gap filling characteristics are excellent and step differences are reduced. But it is difficult for the SOG layer to change into a perfect oxide silicon layer, even though a recovery process for changing the SOG layer into an oxide silicon layer is performed through successive heat treatment. A disadvantage of use of a SOG layer is that it is easily removed during an etching process or a cleaning process, because the SOG layer does not have a compact structure. In the case of an organic SOG layer, heat treatment is difficult, and organic components which remain may affect semiconductor device operations. Also, shrinkage may occur after coating. Consequently, a crack may form in the SOG layer during heat treatment after forming the layer, and a stress difference is generated by thermal expansion in accordance with partial recovery states, resulting in a device which may be prone to crack or become defective.

Accordingly, a need exists for a semiconductor device having a trench isolation layer and a fabrication method to reduce defects of the SOG layer.

SUMMARY OF THE INVENTION

A semiconductor device having a trench isolation layer in a semiconductor substrate is provided, wherein the trench isolation layer includes a silicon nitride-liner, a silicon oxide liner; and a buried layer, wherein the buried layer includes a first buried layer for filling a lower part of the trench isolation layer and a second buried layer for filling an upper part of the trench isolation layer.

Preferably, the first buried layer includes an SOG (Spin On Glass) layer, the second buried layer is an HDP-CVD (High Density Plasma Chemical Vapor Deposition) oxide layer. The silicon oxide liner includes an HTO (High Temperature Oxide) layer densified at a temperature over 800° C. The silicon oxide liner in an upper part of the trench isolation layer is thinner than a lower part of the silicon oxide liner. An upper surface of the first buried layer is recessed about 1000 Å from the upper surface of the semiconductor substrate.

A semiconductor device preferably further includes a silicon oxide layer disposed between the semiconductor substrate and the silicon nitride liner. The silicon oxide layer includes a thermal oxide layer densified at a temperature over about 800° C.

A method of forming a trench isolation layer of a semiconductor device is also provided which includes the steps of: forming a trench-etching pattern for defining an active area on a substrate; forming an isolation trench on the substrate using the trench etching pattern as an etching mask; forming a silicon nitride liner on an inner wall of the trench, forming a silicon oxide liner on an inner side of the silicon nitride liner; performing heat treatment for hardening the silicon oxide liner; partially filling the trench having the silicon oxide liner with a first buried layer; partially recessing an upper surface of the first buried layer by etching; and filling the trench by depositing the second buried layer on the first buried layer whose upper surface is partially recessed.

The method preferably further includes a step of forming a thermal oxide layer on the inner wall of the trench, between the step of forming the trench and the step of forming the silicon nitride layer. And the method preferably further includes the steps of: exposing an upper part of the trench etching pattern, by removing the second buried layer with a planarization etching; and selectively removing the trench etching pattern.

According to a preferred embodiment of the present invention, the silicon oxide liner includes an HTO oxide layer, and the heat treatment is performed over about 1100° C. for about 30 minutes to about 90 minutes. The step of filling the first buried layer includes an SOG layer, and a curing step for changing the SOG layer into a silicon oxide layer is further included, before the step of etching the first buried layer. The SOG layer includes a polysilazane series material, and the curing step is performed at a temperature of about 700° C. to about 800° C. for about 10 minutes to about 60 minutes. The step of depositing the second buried layer includes HDP-CVD. The step of etching the first buried layer is processed by wet etching.

BRIEF DESCRIPTION OF THE DRAWINGS

The above and other objects and advantages of the present invention will become more apparent by describing in detail preferred embodiments thereof with reference to the accompanying drawings, in which.

DETAILED DESCRIPTION OF PREFERRED EMBODIMENTS

Figure 1:
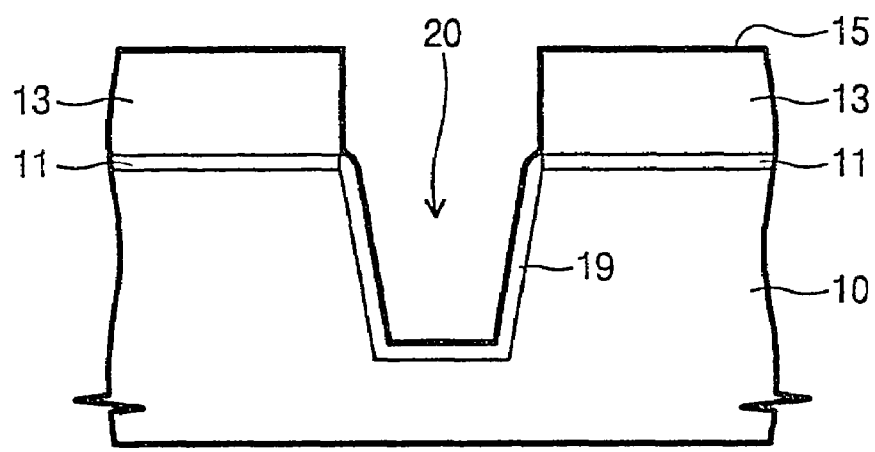
FIGS. 1 through 6 are sectional views of structures illustrating a method of forming a semiconductor device having a trench isolation layer according to the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervention layers may also be present. Moreover, each embodiment described and illustrated herein includes its complementary conductivity type embodiment as well. Like numbers refer to like elements throughout.

FIG. 1 illustrates the steps of forming a trench 20 on a silicon substrate 10. Referring to FIG. 1, a pad oxide layer 11 and a silicon nitride layer 13 are sequentially formed on the silicon substrate 10. Then, the silicon nitride layer 13 is patterned using a photoresist pattern (not shown) as an etching mask. The silicon nitride layer 13 is used as an etching mask during formation of a trench 20 in the silicon substrate 10. After removing photoresist pattern (not shown), using patterned silicon nitride layer 13 as a shield, the silicon substrate 10 is etched and a trench 20 as shown in FIG. 1 is formed. The pad oxide layer 11 may be formed by thermally oxidizing an upper surface of the silicon substrate 10 and may have a thickness in a range between about 100 Å and about 240 Å. An annealing step is then performed to cure crystal defects caused by an etching process on an inner wall of the trench 20. A thermal oxide layer 19 having a preferred thickness in a range between about 30 Å and about 110 Å is formed on the inner wall of the trench 20. The thermal oxide layer 19 is not form on the silicon nitride layer 13 because the silicon nitride 13 does not have oxide source. And then, to prevent the deterioration of a refresh feature of a semiconductor device due to pitting caused by the oxidation of the walls of the trench, a silicon nitride liner 15 is formed as a stress relief layer on the exposed surface including the thermal oxide layer 19 and a silicon nitride layer 13 using a low pressure chemical vapor deposition technique (LPCVD). The silicon nitride liner 15 has a thickness in a range between about 70 Å and about 300 Å, and more preferably about 100 Å.

Figure 2:
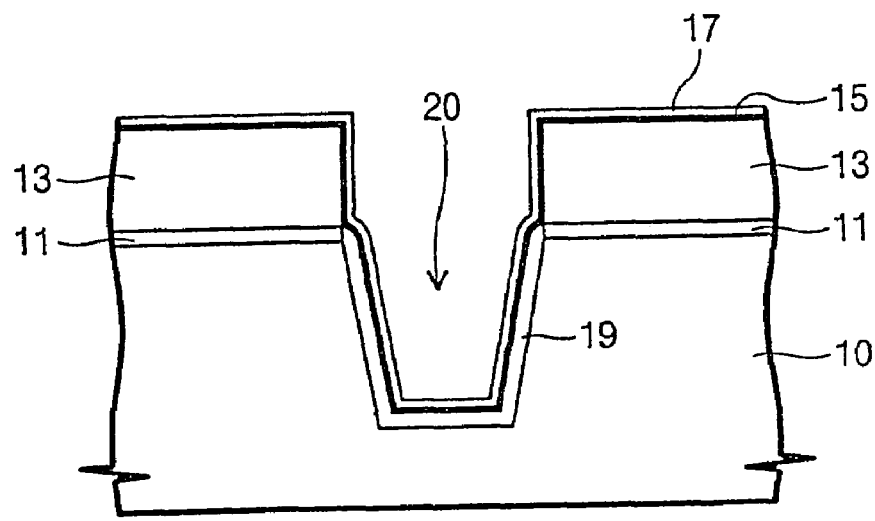

Referring to FIG. 2, a high temperature thermal oxide (HTO) layer 17 is deposited on the silicon nitride liner 15 to have a thickness of about 200 Å. The HTO layer 17 is a liner for protecting the silicon nitride liner 15 and it is formed at a temperature of about 790° C. Generally, for an HTO layer not being densified, a thickness of 350 Å may be consumed by a successive treatment with LAL 200 solution for about 30 seconds and SC1 cleaning solution for about 10 minutes. The LAL 200 solution is composed of a mixture of HF and $NH_4Cl$. SC1 solution is a kind of cleaning solution in which the volume ratio of $NH_4OH:H_2O_2:H_2O$ is about 1:4:20. After depositing the HTO layer 17, the HTO layer 17 is densified. The temperature for the densification is over about 800° C., and it is preferable that the densification is performed for about 30 to about 90 minutes at a high temperature over about 1100° C.

After the densification process, the etching rate of the HTO layer 17 is inversely proportional to temperature. If the densification is performed at a temperature of about 900° C. for 60 minutes, the HTO layer 17 is etched about 250 Å with above mentioned successive treatment. Similarly, if the densification process is performed at a temperature of about 1000° C. for 60 minutes, the HTO layer 17 is etched about 210 Å, and if the densification process is performed at a temperature of about 1150° C. for 60 minutes, the HTO layer 17 is etched about 145 Å with the same successive treatment.

Figure 3:
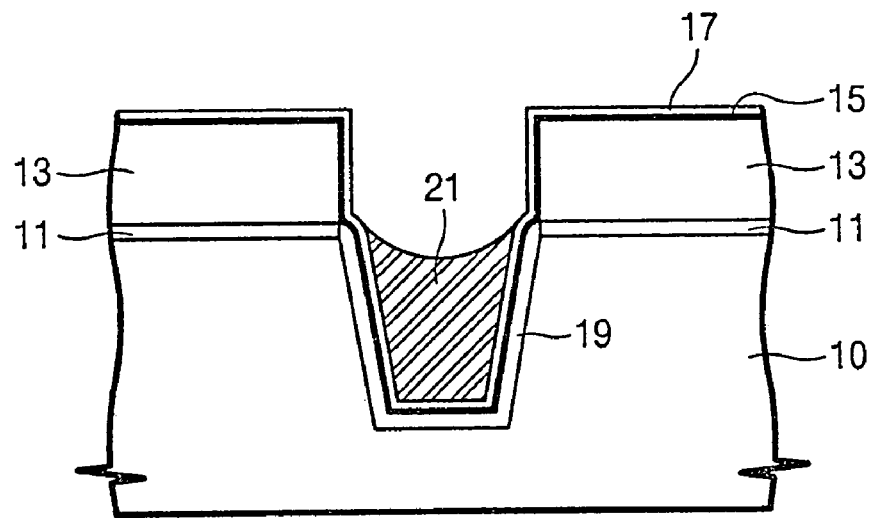

Referring to FIG. 3, a first buried layer 21 is formed on the densified HTO layer 17. According to a preferred embodiment of the present embodiment, the first buried layer 21 is a spin-on-glass (SOG) layer and polysilazane series are used for the the first buried layer 21. As for the polysilazane series, —[SiH$_2$NH]n-type perhydropolysilazane, in which a high thermal treatment is easily processed with solid components, is dissolved in a solution such as dibutyl ether. The polysilazane solution contains about 5 to about 15 weight percent of perhydro-polysilazane. Thickness of the first buried layer 21 can be controlled according to a weight percent of a solid in a polysilazane solution and a spinner speed used for coating. Thus, in the case when a solid content is small and a solid viscosity is low, the first buried layer 21 is formed in the trench 20 (FIG. 2) mostly. And the coating layer 21 may not be appeared on the HTO layer 17.

After forming the first buried layer 21, the first buried layer 21 is changed to a silicon oxide layer by thermal treatment. The changing process is mainly divided into a bake step and an annealing step. In a bake step, a pre-bake is performed at a temperature of about 80° C. to about 350° C., and a hard-bake is performed at about 400° C. But, it can be possible to combine those two processes. During the pre-bake step, most solvents are removed for a several minutes. And next, during the hard-bake step, solvents and a silane gas, a nitrogen gas, and a hydrogen gas can be exhausted from the first buried layer 21.

During the annealing step, the first buried layer 21 is mostly changed to an oxide silicon layer by transposing organic components or hydrogen components of the polysilazane into oxygen for about 10 to about 60 minutes at a high temperature of about 700° C. to about 800° C. When the first buried layer 21 is not sufficiently changed to the oxide silicon layer, the first buried layer 21 can be removed before eliminating the HTO layer 17, because the etching rate of the first buried layer 21 is higher than the HTO layer 17. However, as it is hard to control the amount of the first buried layer 21 remaining in the trench 20 (in FIG. 2) with regular thickness, and the entire first buried layer 21 can be removed, therefore, the annealing is necessary.

Figure 4:
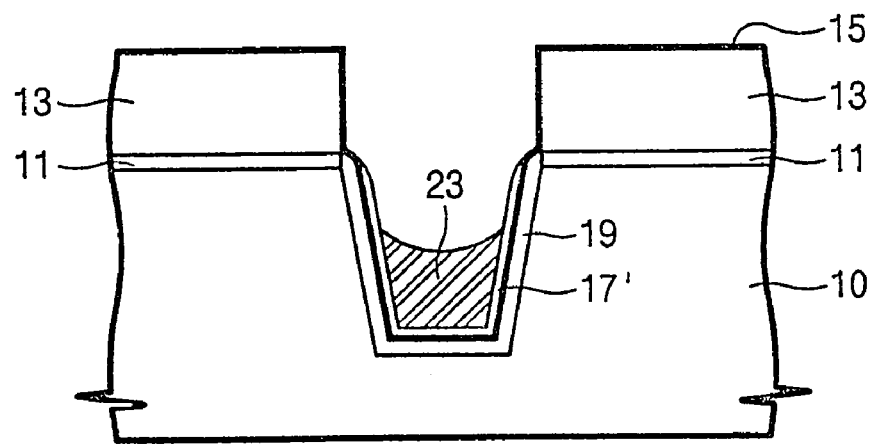

Referring to FIG. 4, the first buried layer 21 (in FIG. 3) is partially removed by etching, so that a recessed first buried layer 23 is formed. According to an embodiment of the present invention, the upper surface of the first buried layer 23 obtained by an etching result has to be lowered to a downward depth of about 1000 Å. The etching of the first buried layer 21 (in FIG. 3) can be performed by a wet etching using an etchant such as LAL 200 or dry etching.

Figure 5:
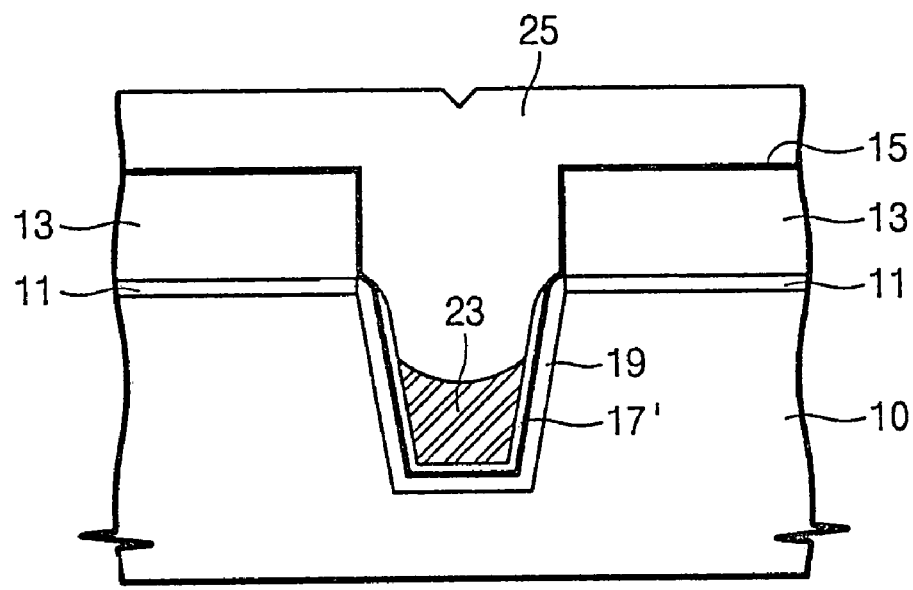

When the first buried layer 21 (in FIG. 3) is etched, the HTO layer 17 (in FIG. 3) formed on the silicon nitride liner 15 (in FIG. 3).is also etched. However, as the HTO layer 17 (in FIG. 3) is densified, the etch rate of the HTO layer 17 (in FIG. 3) is lower than the first buried layer 21 (in FIG. 3). And the HTO layer 17 (in FIG. 3) under the first buried layer 21 (in FIG. 3) is partially etched during forming the recessed first buried layer 23 and remains in the trench as a remaining HTO layer 17'. So the thickness of the remaining HTO layer 17' under the recessed first buried layer 23 is thicker than the exposed remaining HTO layer 17'. Referring to FIG. 5, after forming the recessed first buried layer 23 and the remaining HTO layer 17', a silicon oxide layer 25 is deposited to sufficiently fill the trench through high density plasma-chemical vapor deposition (HDP-CVD) process. If the remaining HTO layer 17' is not formed, the lower layer, the silicon nitride layer 15, of an upper edge of the trench may be damaged by plasma and may be removed during the HDP-CVD process. However, according to a present embodiment, the silicon nitride liner 15 disposed inside of the trench is protected by the remaining HTO layer 17', so that the silicon nitride liner 15 can remain in the trench during the HDP-CVD process.

Figure 6:
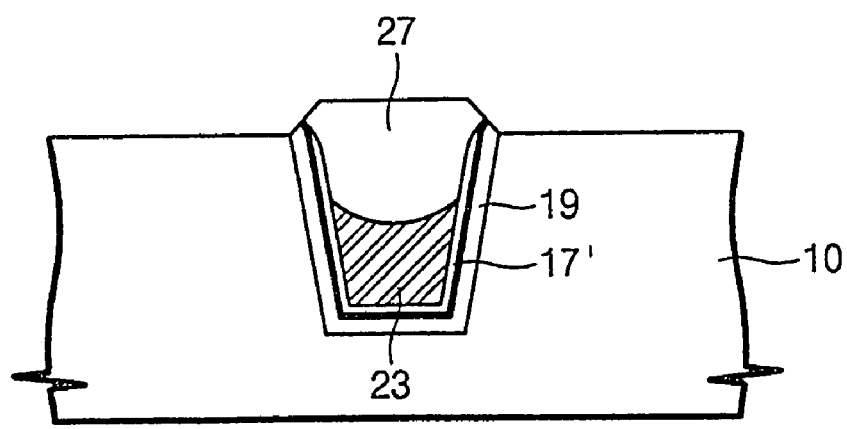

Referring to FIG. 5 and 6, after performing densification of the silicon oxide layer 25, an upper part of the silicon oxide layer 25 is removed through chemical mechanical polishing (CMP) process until the silicon nitride layer 13 is exposed. And then, the exposed silicon nitride layer 13 is removed by wet-etching process. The etchant for wet etching includes a phosphoric acid. The etchant preferably has a relatively low selectivity of the pad oxide layer 11 with respect to the silicon nitride layer 13. And also the pad oxide layer 11 is removed by wet etching, then, the silicon substrate 10 of the active area is opened. In this process, some portions of the silicon oxide layer 25 filling the trench is removed during the wet etching process, so that a height of recessed silicon oxide layer 27 is similar as the height of the silicone substrate 10.

As described above, the isolation layer is mainly divided into an upper part and a lower part. The lower part of the trench includes the thermal oxide layer 19, the silicon nitride liner 15, the remaining HTO layer 17', and the recessed first buried layer 23. According to an embodiment of the present invention, the thickness of the silicon nitride liner 15 in the lower part of the trench is about 200 Å. The upper part of the trench includes the thermal oxide layer 19, the silicon nitride liner 15, the remaining HTO layer 17', and the recessed silicon oxide layer 27. According to an embodiment of the present invention, the thickness of the remaining HTO layer 17' in the upper part of the trench is thinner than the remaining HTO layer 17' in the lower part of the trench.

Advantageously, using the above described method, in forming a trench isolation layer of a semiconductor device having a high aspect ratio, it is efficient to prevent removal of the silicon nitride liner in the trench by the remaining HTO layer 17'. As a result, any leakage current and semiconductor element deterioration caused by a silicon substrate defect can be prevented.

Although the present invention has been described herein with reference to the accompanying drawings, it is to be understood that the present invention is not limited to those precise embodiments, and various other changes and modifications may be affected therein by one skilled in the art without departing from the scope or spirit of the present invention. All such changes and modifications are intended to be included within the scope of the invention as defined by the appended claims.

What is claimed is:

1. A method of forming a trench isolation layer of a semiconductor device, comprising the steps of:
   forming a trench-etching pattern for defining an active area on a substrate;
   forming an isolation trench on the substrate using the trench-etching pattern as an etching mask;
   forming a silicon nitride liner on inner walls of the trench;
   forming a silicon oxide liner on inner sides of the silicon nitride liner;
   performing heat treatment for hardening and densifying the silicon oxide liner;
   filling the trench having the silicon oxide liner by depositing a first buried layer of silicon oxide;
   partially etching the hardened and densified silicon oxide liner formed under the first buried layer of silicon oxide during recessing an upper surface of the first buried layer by etching; and
   filling a remaining portion of the trench by depositing a second buried layer of silicon oxide on the first buried layer whose upper surface has been partially recessed by the etching.

2. The method of claim 1, further comprising a step of forming a thermal oxide layer on the inner walls of the trench before the step of forming the silicon nitride liner.

3. The method of claim 1, wherein the silicon oxide liner includes an HTO oxide layer, and the heat treatment is performed over about 1100° C. for about 30 minutes to about 90 minutes.

4. The method of claim 1, wherein the step of filling the trench with the first buried layer includes an SOG layer, and further comprising a curing step for changing the SOG layer into a silicon oxide layer before the step of etching the first buried layer.

5. The method of claim 4, wherein the SOG layer includes a polysilazane series material, and the curing step is performed at a temperature of about 700° C. to about 800° C. for about 10 minutes to about 60 minutes.

6. The method of claim 1, wherein the step of depositing the second buried layer includes performing HDP-CVD.

7. The method of claim 1, further comprising the steps of:
   exposing an upper part of the trench etching pattern by removing a portion of the second buried layer with a planarization etching; and
   selectively removing the trench etching pattern.

8. The method of claim 1, wherein the step of etching the first buried layer is processed by wet etching.

9. The method of claim 1, wherein an etch rate of the silicon oxide liner is lower than an etch rate of the first buried layer of silicon oxide.

* * * * *